United States Patent [19]

Huggins

[11] 4,278,931
[45] Jul. 14, 1981

[54] LOCATION OF CONTACT FAULTS ON ELECTRICALLY CONDUCTIVE CABLES

[75] Inventor: Ernest E. J. Huggins, Seaford, England

[73] Assignee: The Post Office, London, England

[21] Appl. No.: 6,647

[22] Filed: Jan. 26, 1979

[30] Foreign Application Priority Data

Jan. 27, 1978 [GB] United Kingdom ............... 3456/78

[51] Int. Cl.³ ........................................... G01R 31/08
[52] U.S. Cl. ................................. 324/52; 324/65 R
[58] Field of Search ...................... 324/62 R, 65, 52

[56] References Cited

U.S. PATENT DOCUMENTS

| | | | |
|---|---|---|---|
| 1,034,609 | 8/1912 | Friendly | 324/52 |
| 3,358,226 | 12/1967 | Clinton | 324/52 |
| 3,705,346 | 12/1972 | Jedvall | 324/52 |
| 3,706,927 | 12/1972 | Jedvall | 324/52 |
| 3,800,216 | 3/1974 | Hamilton | 324/52 |

Primary Examiner—Michael J. Tokar
Attorney, Agent, or Firm—Larry S. Nixon

[57] ABSTRACT

The invention relates to the location of contact faults on electrically conductive cables such as telephone pairs. Contact fault location apparatus has a pair of resistors, a constant current source, and means such as a differential amplifier and meter for sensing the current flowing in the resistors. A pair of lines to be tested is looped at one end, the apparatus is connected across the other end and the current flowing in the resistors is measured. The ratio of the current is indicative of the distance to the fault.

13 Claims, 9 Drawing Figures

LOCATION OF CONTACT FAULTS ON ELECTRICALLY CONDUCTIVE CABLES

DESCRIPTION

This invention relates to the location of contact faults on electrically conductive cables such as underground telephone cables or electrical power cables.

Contact faults usually take the form of either earth contact faults or battery contact faults. In both cases the fault can vary in intensity and this makes accurate location difficult.

Conventional techniques for locating earth or battery contact faults use the well known bridge principle. In this technique a pair of electrical lines under test is looped at its distant end and a tester is applied to the pair at the other end. The tester includes fixed and variable resistors which are so arranged to form with the pair a bridge network. The bridge is balanced and the combination of variable resistors required to balance the bridge are calculated and referenced to the resistance of the electrical conductor pair to obtain the distance to the fault. An earth fault resistance can be any resistance between 0 and 500Ω, and in order to obtain sufficient current for balance, the commonly used type of bridge requires two internal battery sources of 9 volts to 500 volts. In view of the fact that the fault resistance is frequently a variable resistance it is extremely difficult to obtain a balance. The 500 volts battery source is used with high resistance faults and to obtain the required measuring current, but if the variable bridge resistors are set to a low value when the test is begun there will be a higher current passed through the fault which may be sufficient to disturb or even clear it. Thus it will be seen that the conventional bridge technique suffers from shortcomings.

It is an object of the present invention to provide a technique for locating contact faults on electrically conductive cables which is relatively simple to use and not subject to the above-mentioned shortcomings.

We provide a technique for locating faults on electrically conductive cable pairs, e.g. telephone pairs, in which two resistors are connected across one end of the pair the other end of which is looped, a constant current generator is connected to the junction of the two resistors and the current flowing in each resistor is measured. The ratio of the currents flowing in each resistor is indicative of the position of any contact fault.

According to one aspect of the present invention there is provided a method of locating contact faults on electrically conductive cable pairs comprising looping the pair at one end thereof, connecting two resistors across the other end of the pair, connecting a constant current source to the junction of the two resistors and measuring the current flowing in each resistor. The ratio of the two currents can be used to obtain an indication of the position of a fault. The method may also include the step of connecting the constant current source across one of the resistors and measuring the current flowing in each resistor.

According to another aspect of the present invention there is provided apparatus for locating a contact fault on electrically conductive cable pairs comprising a pair of resistors arranged to be connected across one end of the cable pair the other end of which is looped, a constant current source connected to the junction of the resistors and means responsive to the current flowing in the resistors to provide an indication of any contact fault.

The responsive means may include a differential amplifier connected across the two resistors and a current measuring meter connected to the output of the amplifier. The meter may be calibrated in units of distance. Alternatively the meter may be connected to a variable resistor which is arranged to provide a signal to offset the output of the amplifier, the variable resistor having a control knob calibrated in units of distance.

A switch may be connected in circuit with the constant current source, the switch in a first position connecting the source between the junction of the two resistors and earth and in a second position connecting the source across one of the resistors.

The invention will be described now by way of example only with particular reference to the accompanying drawings. In the drawings.

Figure 1:
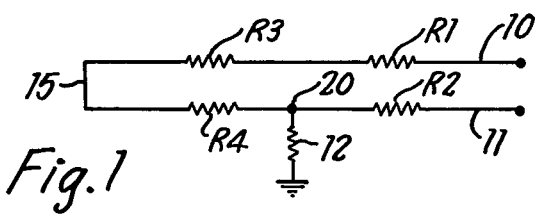
FIGS. 1 to 3 are schematic circuit diagrams illustrating the principle of the present invention.

Referring to FIG. 1 a pair of telephone lines are represented at 10 and 11. An earth fault resistance 12 is shown as existing on the line 11. The line is looped at 15 and the resistances of the portions of the line between the fault and the looped end are shown as R3 and R4 whilst the resistances between the fault and the other end of the lines are shown as R1 and R2. If current is applied through the fault resistance 12 it will divide at the point shown as 20 so that one part flows through R2 whilst the remainder flows through R4, R3 and R1. If the source providing current through the fault resistor is a constant current source bridge balancing will be relatively simple.

Figure 2:
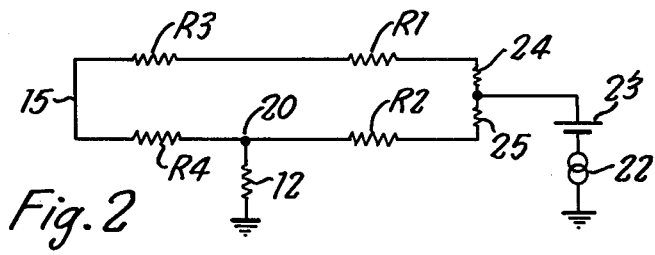

An arrangement with a constant current source is shown schematically in FIG. 2. The constant current source is shown at 22 and is connected in series with a voltage source 23 between earth and the junction of two resistors 24 and 25 which are connected across the pair of lines under test. The voltage source is typically 300 volts and the constant current source is set to approximately 150μ amp (0.1% stability). The value of the fault resistance determines the voltage required, for example at 15 kΩ fault would require 2.25 volts to maintain 150 μamp whereas a fault of 500 kΩ would require 75 volts ignoring line resistance. This voltage requirement is automatically evaluated by a unit which contains the constant current source 22 and voltage source 23. This unit has an extremely rapid operation so that even if the fault resistance varies the current at the point 20 remains constant.

Considering the operation of the arrangement of FIG. 2 the current flowing through the fault resistance to the point 20 divides proportionally into the resistor R2 and into the resistors R4, R3, R1. Proportionate currents will flow via the resistors 24 and 25 but the total current will be 150 μamp. Now R2 is the resistance of the line between the fault and the test equipment, R1 is the equivalent resistance in the other one of the pair of the lines, R4 is the resistance of the line from the fault to the far end of the line and R3 is the equivalent resistance of the other one of the pair of lines. Thus, R1=R2, R3=R4. As R1=R2 the difference in current is determined by R3+R4. Thus, it can be said that the difference in current through resistor 24 and resistor 25 will be in the ratio of R2 to R4. R2+R4=the total single wire resistance of the line and if this resistance is known or can be calculated then the ratio of the currents in resistors 24 and 25 can be used to evaluate the position of the point 20.

Figure 3:
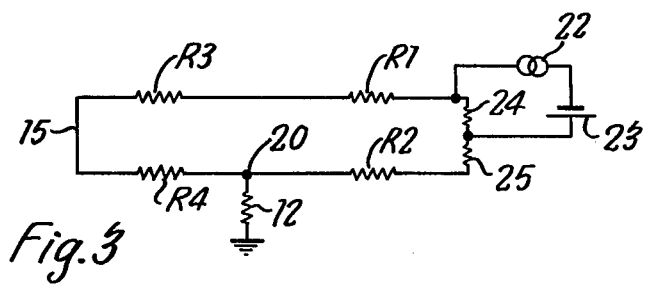

An alternative arrangement for the connection of the constant current source is shown in FIG. 3. In this arrangement the constant current source is connected across the resistor 24. In this arrangement the looped line passes current via R1, R3, R4, R2 to the resistor 25. The difference in current through resistor 24 and resistor 25 is now due to the total looped line resistance.

Figure 4:
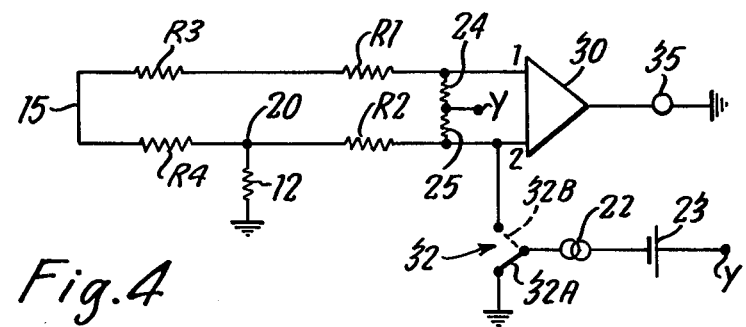
FIG. 4 is a circuit diagram illustrating one embodiment in accordance with the present invention.

Thus in order to provide practical circuits using the principles shown in FIGS. 1 to 3 it is necessary to have some means of measuring the voltages across the resistances 24 and 25. This can be done by using a differential amplifier. Such an arrangement is shown in FIG. 4 of the drawings. The differential amplifier 30 is connected across the ends of the lines under test. A switch 32 is provided and arranged so that the constant current source 22 can be connected either between earth and the junction of resistors 24 and 25 or directly across the resistor 25. Thus the apparatus shown in FIG. 4 can be used to carry out both of the tests shown in FIG. 2 and FIG. 3. The output of the amplifier is connected to a suitable meter 35.

When the movable contact of the switch 32 is in the position indicated at 32A current passes from the constant current source 22 via earth to the fault resistance. The current difference through the resistors 24 and 25 is measured as the voltage at the inputs 1 and 2 of the amplifier 30, referenced to the point Y. The amplifier gives an output equivalent to this difference. The voltage at the terminal 1 will be the lower voltage because of the line resistance beyond the point 20. Thus the output of the amplifier is actually indicating the equivalent distance from the fault to the distant end (after calibration for conductor size). It is necessary to reference the amplifier output to the line condition and this can be achieved by lowering the gain of the input 2 of the amplifier and adjusting the output to zero.

The switch 32 is then operated so that its movable contact is in position 32B. Current from the constant current source passes through the resistor 24 and the looped line to resistor 25. The difference reading should now be due to the total looped line resistance, but as the gain of input 2 was lowered to account for the resistance of R3 and R4 the actual reading will be due to R1+R3+R4+R2−(R3+R4) which=R1+R2. The amplifier is adjusted to divide the reading by 2 and therefore the output can be taken as the voltage drop across R2 which corresponds to the distance to the fault.

Thus in practical terms the functions performed by the equipment shown in FIG. 4 are as follows:
(1) adjust gain of amplifier.
(2) calibrate conductor size.
(3) carry out test shown in FIG. 2 (constant current value earth fault).
(4) carry out test shown in FIG. 3 (constant current flowing around the looped line).

The testing equipment described above is relatively simple to use and only resistors 24 and 25 need to be of high precision types. The use of a constant current source means that the effects of variations in the fault resistance are substantially eliminated.

Figure 5A:
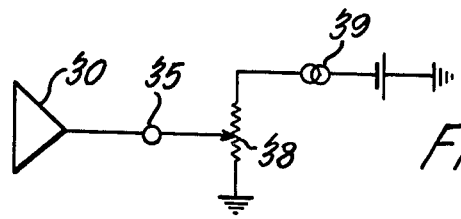
FIGS. 5a and 5b are circuit diagrams illustrating part of the embodiment shown in FIG. 4.
Figure 5B:
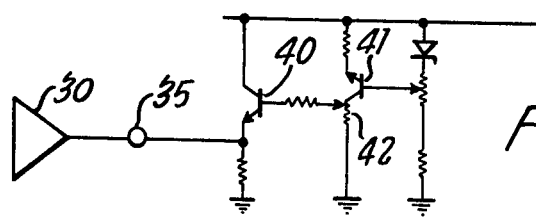

In its simplest form the output meter can be directly calibrated in terms of distance to the fault but extreme accuracy demands a more complex measuring circuitry. An alternative arrangement is shown in FIGS. 5a and 5b. As shown in FIG. 5a the output of the amplifier is fed to the meter 35 which is connected to the movable contact of a variable resistor 38. A constant current source 39 is connected in series with variable resistor 38. The arrangement is such that the voltage drop across the resistor 38 is equivalent to the output range of the amplifier 30. An output reading from the amplifier 30 on the meter 35 is cancelled by adjusting the variable resistor to provide an equivalent voltage to the meter, this voltage being representative of the distance to the fault. The resistor 38 is adjustable by means of a knob which is calibrated in units of distance so that a direct reading of the distance to the fault can be obtained. A typical calibration range is 0–1000 meters.

This arrangement allows a meter which is more economic and robust than an arrangement in which the meter gives the distance reading directly.

FIG. 5b shows an arrangement in which transistors 40, 41 and a variable resistor 42 are included to allow a centre zero calibration of the meter using a pre-bias voltage. The four steps referred to above are referred to this zero position.

Figure 6:
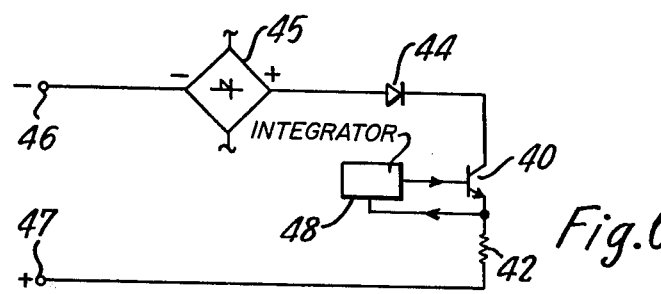
FIG. 6 is a circuit diagram of a constant current source.

The constant current source 22 is shown in more detail in FIG. 6. It comprises a transistor 40 the collector-emitter of the circuit of which is connected in series with a resistor 42, a diode 44, and a bridge rectifier 45 between terminals 46 and 47. An integrator circuit 48 is connected between the base and the emitter of the transistor 40. In use the terminals 45 and 47 are connected to the line under test. The constant current supply is controlled by the integrator circuit 48 which samples the current flowing through the emitter of the transistor 40 and resistor 42.

The principle of the present constant current contact fault device makes possible new techniques for fault locating. A severe restriction on all bridge principles is the possibility of multiple faults on the same pair. Any existing bridge tester would tend to give an average of all the faults existing.

Figure 7:
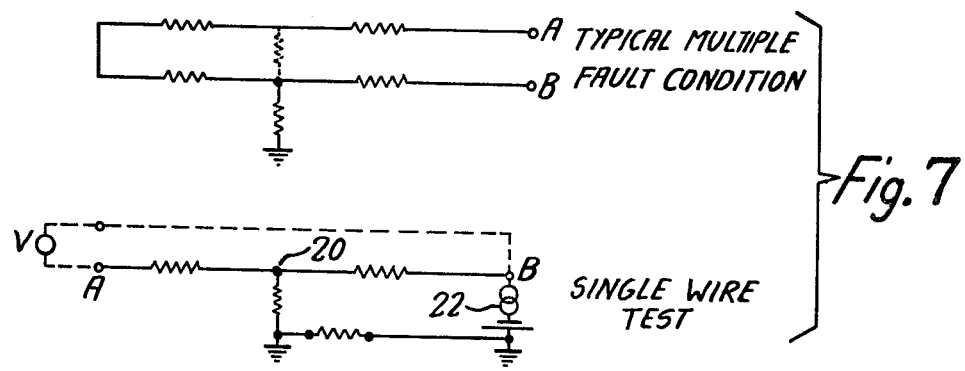
FIG. 7 illustrates the manner in which the present invention can be used to locate multiple faults.

A common fault consists of one leg with a fault to earth whilst a partial short circuit exists between the pair. The present principle may make it possible to overcome this condition by testing on a single wire referring to FIG. 7. The constant current source is connected between line and earth so that current will flow through the line and via the fault to the unit. If the voltage at point B can be compared with the voltage at point 20 and as the current is known, then the resistance of the line and consequently the distance to the fault can be calculated.

To explain the theory, it can be seen that if a reference wire is now connected at point B and a voltmeter of extremely high input impedance is connected as shown the voltage drop across the length B to 20 will be indicated. Several integrated circuits are available which would allow an input impedance of, say, 100 MΩ and the resistance of the reference wire and line between A and 20 could be ignored. The reference wire technique is not unknown with existing practices and is in use on a large proportion of bridge measurements.

Several methods are now available to confirm the accuracy of the measurements. It will be seen that in FIG. 7 the total current will flow via point 20. If now a constant current device of exactly half the value of the originating source is connected between point A and earth the voltage reading will contain the original B to 20 reading plus a voltage drop (at half current) across A to 20. Therefore, if the original reading is subtracted from the second test and the resultant reading is doubled the two test readings can be added together to find the total length of the line. If the entire test is now performed from the other end of the line (reverse position of constant current generator and voltmeter) the two readings B to 20 and A to 20 should add up to the total line length. This explanation of the theory tends to exaggerate the work involved, in fact most of the functions could be carried out by a single amplifier control.

The half value constant current device is commercially available and takes the form of a constant current diode. If now two or more faults existed on the line the first and second test readings would not agree and with further elaboration of this theory it may be possible to approach each of the fault points in turn. As a further check by the operator, if another fault exists which is of a varying nature one or both of the tests would also give a varying reading.

Figure 8:
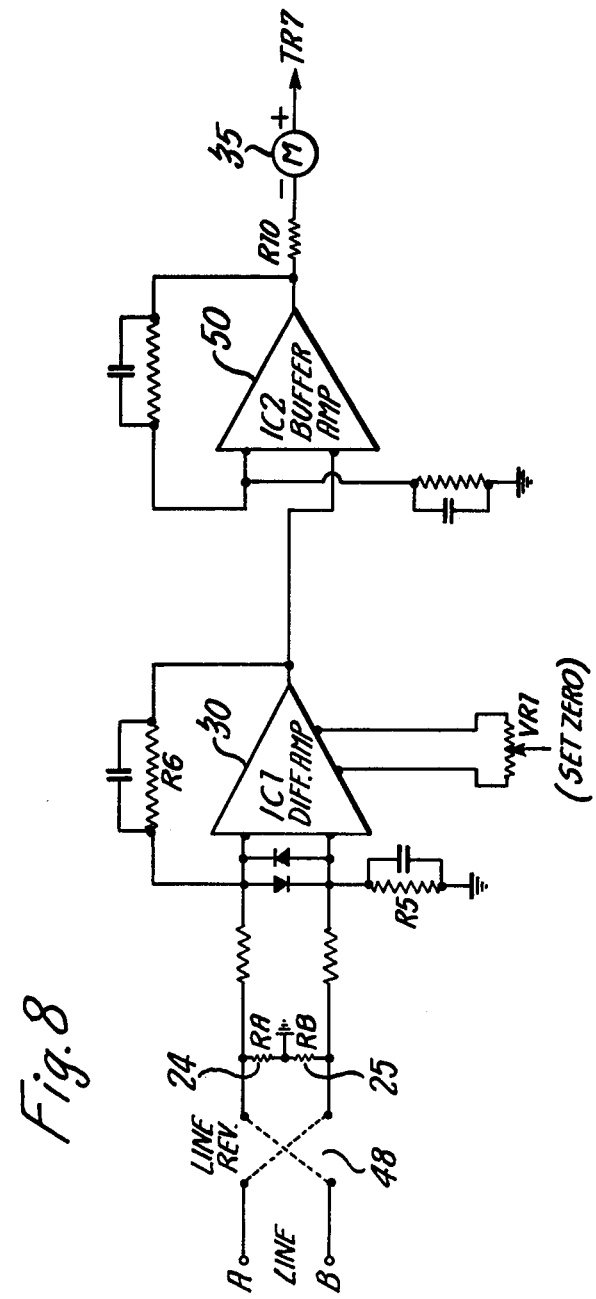
FIG. 8 is a circuit diagram of another embodiment of the present invention.

A circuit which allows the present apparatus to be used in conjunction with pulse echo type equipment is shown in FIG. 8. In this circuit the differential amplifier 30 is connected to the line under test by a reversing switch 48. The output of the amplifier 30 is connected by a further buffer amplifier 50 to the meter 35. The amplifiers 30 and 50 provide 50 hz component suppression. The meter 35 is also used by the pulse echo equipment.

I claim:

1. A method of locating contact faults on electrically conductive cable pairs comprising looping the pair at one end thereof, connecting two resistors across the other end of the pair, connecting a constant current source to the junction of the two resistors and measuring the current flowing in each resistor, the ratio of said currents being indicative of the position of the fault.

2. A method as claimed in claim 1 including the step of connecting the constant current source across one of said resistors and measuring the current flowing in each resistor.

3. Apparatus for locating a contact fault on electrically conductive cable pairs comprising a pair of resistors arranged to be connected across one end of the cable pair, the other end of which is looped, a constant current source connected to the junction of the resistors and means responsive to the current flowing in the resistors to provide an indication of any contact fault.

4. Apparatus as claimed in claim 3 wherein said responsive means include a differential amplifier connected across the two resistors and a current measuring meter connected to the output of the amplifier.

5. Apparatus as claimed in claim 4 wherein said meter is calibrated in units of distance.

6. Apparatus as claimed in claim 4 wherein said meter is connected to a variable resistor which is arranged to provide a signal to offset the output of the amplifier, the variable resistor having a control knob calibrated in units of distance.

7. Apparatus as claimed in any one of claims 3, 4, 5 or 6 including a switch connected in circuit with the constant current source, the switch in a first position connecting the source between the junction of the two resistors and earth, and in a second position connecting the source across one of the resistors.

8. Apparatus as claimed in any one of claims 3, 4, 5 or 6 wherein said constant current source comprises a bridge rectifier, a transistor having its collector-emitter circuit connected in series with the rectifier and an integrator connected between the base and emitter of the transistor.

9. A method of locating a contact fault along an extended pair of electrical conductors, said method comprising the steps of:
   electrically shorting said pair at one end thereof;
   connecting two series connected resistances across the other end of said pair;
   connecting a constant current source from the junction of said resistances through the contact fault regardless of the actual or varying resistance of said fault, said constant current dividing at the contact fault to pass proportionally in initially opposite directions through the now interconnected looped pair of conductors and back to said junction of said resistances;
   measuring the difference in currents passing through said resistances with a differential amplifier having two inputs connected across said series connected resistances;
   adjusting one of the differential amplifier inputs so as to null the amplifier output, thus accounting for the portion of the conductor pair extending beyond the fault location;
   reconnecting said constant current across one of said resistances; and
   measuring the resulting amplifier output which is proportional to the distance from said other end to said contact fault.

10. Apparatus for locating a contact fault along an extended pair of electrical conductors which are shorted together at the opposite end, said apparatus comprising:
    first and second series connected resistors having known resistances, the series connected combination of resistors being adapted for electrical connection across said pair of electrical conductors at the near, unshorted ends thereof;
    a constant current source adapted for connection between the juncture of said resistors and said contact fault for passing a constant current therethrough regardless of the actual or varying resistance of said fault, said constant current dividing at the contact fault to pass proportionally in initially opposite directions through the interconnected looped pair of conductors and back to the junction of said resistors; and
    measuring means connected across said resistors to measure the relative amounts of electrical currents flowing therethrough.

11. Apparatus as in claim 10 further comprising:
    switch means connected to said constant current source and to said resistors for selectively reconnecting said constant current source across one of said resistors.

12. Apparatus as in claim 10 or 11 wherein said measuring means further comprises input adjustment means for nulling its output while said constant current source is connected to said contact fault.

13. Apparatus as in claim 10 or 11 wherein said constant current source includes at least one active element connected to maintain a substantially constant current output in response to varying loads connected thereto.

* * * * *